(12) United States Patent
Han et al.

(10) Patent No.: US 9,812,335 B2
(45) Date of Patent: Nov. 7, 2017

(54) METHOD OF FORMING FINE PATTERN OF SEMICONDUCTOR DEVICE

(71) Applicant: SAMSUNG ELECTRONICS CO., LTD., Suwon-si (KR)

(72) Inventors: Je-Woo Han, Hwaseong-si (KR); Junho Yoon, Suwon-si (KR); Kyohyeok Kim, Seoul (KR); Dongchan Kim, Seoul (KR); Sungyeon Kim, Jeongeup-si (KR); Jaehong Park, Seongnam-si (KR); Jinyoung Park, Anyang-si (KR); KyungYub Jeon, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 9 days.

(21) Appl. No.: 15/066,492

(22) Filed: Mar. 10, 2016

(65) Prior Publication Data

US 2016/0293445 A1    Oct. 6, 2016

(30) Foreign Application Priority Data

Apr. 2, 2015    (KR) ........................ 10-2015-0047075

(51) Int. Cl.
*H01L 21/311*    (2006.01)
*H01L 21/768*    (2006.01)

(52) U.S. Cl.
CPC .. *H01L 21/31144* (2013.01); *H01L 21/31116* (2013.01); *H01L 21/76816* (2013.01)

(58) Field of Classification Search
None
See application file for complete search history.

(56) References Cited

U.S. PATENT DOCUMENTS

| | | | |
|---|---|---|---|
| 5,492,446 A * | 2/1996 | Hawkins | F01D 17/162 411/116 |
| 6,046,115 A * | 4/2000 | Molloy | B08B 7/0035 134/1.2 |
| 8,846,540 B2 | 9/2014 | Lee et al. | |
| 2005/0032388 A1 | 2/2005 | Donohoe | |
| 2006/0205220 A1* | 9/2006 | Hudson | H01L 21/0273 438/694 |

(Continued)

FOREIGN PATENT DOCUMENTS

| KR | 10-2004-0015956 A | 2/2004 |
|---|---|---|
| KR | 10-0953022 B1 | 4/2010 |

(Continued)

*Primary Examiner* — Eliseo Ramos Feliciano
*Assistant Examiner* — Joannie A Garcia
(74) *Attorney, Agent, or Firm* — Sughrue Mion, PLLC

(57) ABSTRACT

A method of fabricating a semiconductor device is disclosed. The method may include forming an target layer on a substrate, forming a mask pattern on a target layer, performing a first process to etch the target layer and form a first sub-trench, and performing a second process to further etch the target layer and form a second sub-trench. First and second sidewall patterns may be formed on a sidewall of the mask pattern to be used as an etch mask in the first and second processes, respectively. Outer sidewalls of the first and second sidewall patterns may be formed to have different angles with respect to a top surface of the substrate.

19 Claims, 22 Drawing Sheets

(56) References Cited

U.S. PATENT DOCUMENTS

| | | | |
|---|---|---|---|
| 2008/0090418 A1* | 4/2008 | Jeon | H01L 21/0337 438/689 |
| 2009/0081876 A1 | 3/2009 | Bera et al. | |
| 2010/0075503 A1* | 3/2010 | Bencher | H01L 21/3086 438/703 |
| 2011/0053379 A1 | 3/2011 | Chi et al. | |
| 2014/0057442 A1 | 2/2014 | Lee et al. | |
| 2014/0077126 A1 | 3/2014 | Benson et al. | |
| 2014/0295668 A1 | 10/2014 | Avasarala | |

FOREIGN PATENT DOCUMENTS

| | | |
|---|---|---|
| KR | 10-1120180 B1 | 2/2012 |
| KR | 10-2012-0100003 A | 9/2012 |
| KR | 10-2014-0026086 A | 3/2014 |

* cited by examiner

METHOD OF FORMING FINE PATTERN OF SEMICONDUCTOR DEVICE

CROSS-REFERENCE TO RELATED APPLICATION

This application claims priority from Korean Patent Application No. 10-2015-0047075, filed on Apr. 2, 2015, in the Korean Intellectual Property Office, the disclosure of which is incorporated in its entirety by reference.

BACKGROUND

Methods consistent with exemplary embodiments relate to forming a fine pattern of a semiconductor device.

As the integration density of semiconductor devices increases, a size of an individual component decreases accordingly. For example, there has been a need to reduce widths of transistors and metal lines and occupying areas of capacitors and contact plugs. In order to satisfy the need, a critical dimension (CD) of patterns may be reduced, but this introduces other problems, for example, a contact plug or a contact hole may be formed to have a higher aspect ratio and a deteriorated profile.

SUMMARY

According to example embodiments of the inventive concepts, a method of fabricating a semiconductor device may include forming an etch target layer on a substrate, forming a mask pattern on the etch target layer, performing a first etch process to etch the etch target layer and form a first sub-trench, the mask pattern and a first sidewall pattern formed on a sidewall of the mask pattern being used as a first etch mask in the first etch process, and performing a second etch process to further etch the etch target layer under the first-sub trench and form a second sub-trench, the mask pattern and a second sidewall pattern formed on the sidewall of the mask pattern being used as a second etch mask in the second etch process. An outer sidewall of the first sidewall pattern may have a first angle with respect to a top surface of the substrate, and an outer sidewall of the second sidewall pattern may have a second angle different from the first angle with respect to the top surface of the substrate.

In some embodiments, the first angle may be smaller than the second angle.

In some embodiments, the first sidewall pattern may be formed to conformally cover a top surface and a side surface of the mask pattern, the first sidewall pattern may be formed in such a way that the outer sidewall of the sidewall pattern is substantially perpendicular to the top surface of the substrate, and the second sidewall pattern may be formed in such a way that the outer sidewall of the sidewall pattern is slanted at an angle to the top surface of the substrate.

In some embodiments, the first and second etch processes may be performed using first and second etch gases, respectively, the first sidewall pattern may be a by-product layer that is formed as a result of a chemical reaction between a carbon ion of the first etch gas and a by-product of the etch target layer, and the second sidewall pattern may be a by-product layer that is formed as a result of a chemical reaction between a carbon ion of the second etch gas and a by-product of the etch target layer.

In some embodiments, the second etch process may be performed to change an angle of the outer sidewall of the first sidewall pattern from the first angle to the second angle to form the second sidewall pattern.

In some embodiments, the first and second etch processes may be performed using first and second etch gases, respectively. Here, the first etch gas may be at least one of $C_xF_y$-based gases, where a ratio of y to x ranges from 0 to 2, and $CH_xF_y$-based gases. The second etch gas may be at least one of $C_xF_y$-based gases, where a ratio of y to x ranges from 2 to 4.

In some embodiments, the first etch gas may be at least one of $C_4F_6$, $CHF_3$, and $CH_2F_2$, and the second etch gas may be at least one of $C_4F_8$, $CF_4$, and $CF_3$.

In some embodiments, the second sidewall pattern may be formed by providing an $O_2$ plasma or a $NF_3$ plasma to the first sidewall pattern.

In some embodiments, an inert gas may be provided during the second etch process, not during the first etch process.

In some embodiments, the first and second etch processes may be performed using first and second etch gases, respectively, and the first etch process may be performed in such a way that the first etch gas may have an electron temperature lower than an electron temperature of the second etch gas in the second etch process.

In some embodiments, a xenon gas may be provided during the first etch process, not during the second etch process.

In some embodiments, the first etch process may be performed with a plasma source power, which is lower than that in the second etch process.

In some embodiments, the first and second etch processes may be performed using first and second etch gases, respectively. Here, the first sidewall pattern may be formed to allow for the first etch gas to be injected to the etch target layer at the first angle, and the second sidewall pattern may be formed to allow for the second etch gas to be injected to the etch target layer at the second angle.

In some embodiments, a largest horizontal width of the first sidewall pattern may be larger than that of the second sidewall pattern.

In some embodiments, a unit etch cycle may include the first and second etch processes, and the method may further include repeating the unit etch cycle at least one time.

According to example embodiments of the inventive concepts, a method of fabricating a semiconductor device may include forming a mask structure on a substrate, the substrate provided with an etch target layer, performing a first etch process using the mask structure as a first etch mask to etch the etch target layer and form a first trench, and performing a second process using the mask structure as a second etch mask to further etch the etch target layer that is exposed by the first trench and form a second trench. The first etch process may be performed using a first etch gas containing at least one of $C_xF_y$-based gases, where a ratio of y to x ranges from 0 to 2, and $CH_xF_y$-based gases, and the second etch process may be performed using a second etch gas containing at least one of $C_xF_y$-based gases, where a ratio of y to x ranges from 2 to 4.

In some embodiments, the mask structure used as the first etch mask in the first etch process may include a first sidewall pattern, the first sidewall pattern formed on at least a sidewall of the mask pattern during the first etch process, the mask structure used as the second etch mask in the second etch process may include a second sidewall pattern formed on at least a sidewall of the mask pattern, the second sidewall pattern formed by deforming the first sidewall pattern during the second etch process. The second sidewall pattern may be formed in such a way that an outer sidewall of the second sidewall pattern has a greater angle with respect to a top surface of the substrate than an outer sidewall of the first sidewall pattern.

In some embodiments, the first etch gas may be at least one of $C_4F_6$, $CHF_3$, and $CH_2F_2$, and the second etch gas may be at least one of $C_4F_8$, $CF_4$, and $CF_3$.

According to example embodiments of the inventive concepts, a method of fabricating a semiconductor device may include forming a mask pattern on a substrate, the substrate provided with an etch target layer, performing a first etch process to etch the etch target layer and form a first sub-trench, the mask pattern and a first sidewall pattern formed on top and side surfaces of the mask pattern being used as a first etch mask in the first etch process, and performing a second etch process to further etch the etch target layer and form a second sub-trench, the mask pattern and a second sidewall pattern formed on the side surface of the mask pattern being used as a second etch mask in the second etch process. An outer sidewall of the first sidewall pattern may have a first angle with respect to a top surface of the substrate, an outer sidewall of the second sidewall pattern may have a second angle with respect to the top surface of the substrate, and the first angle may be greater than the second angle.

In some embodiments, the first and second etch processes may be performed using first and second etch gases, respectively, and the first etch process may be performed in such a way that the first etch gas has an electron temperature lower than an electron temperature of the second etch gas in the second etch process.

BRIEF DESCRIPTION OF THE DRAWINGS

The above and/or other aspects will be more apparent by describing certain example embodiments with reference to the accompanying drawings in which.

DETAILED DESCRIPTION

Figure 1:
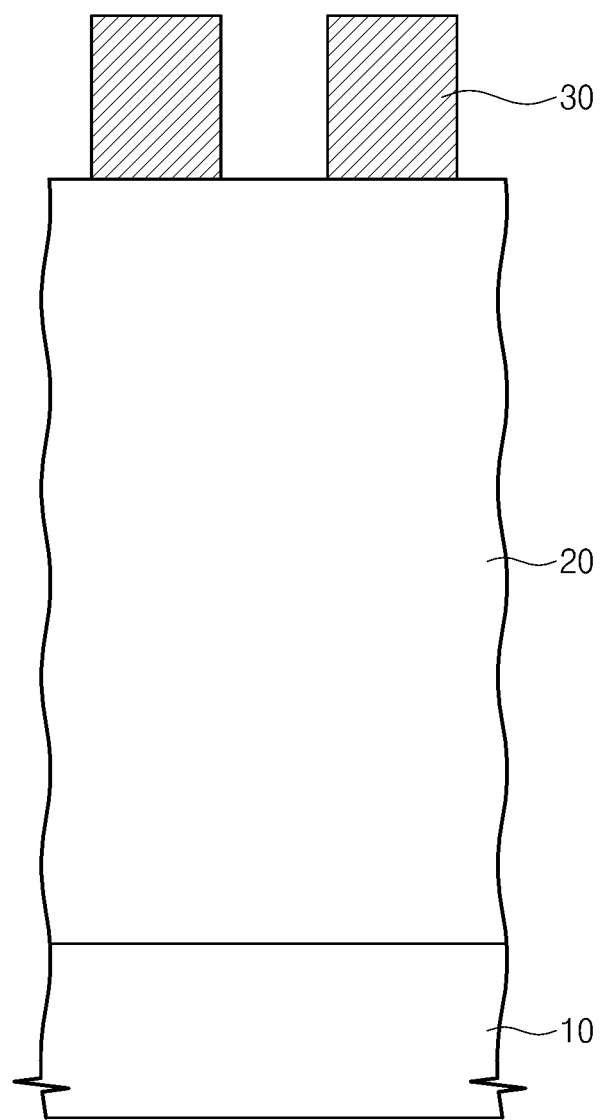
FIGS. 1, 2, 4, 6, 7, and 9 are sectional views illustrating methods of forming a fine pattern of a semiconductor device according to example embodiments of the inventive concepts.

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It should be noted that the drawings are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 2:
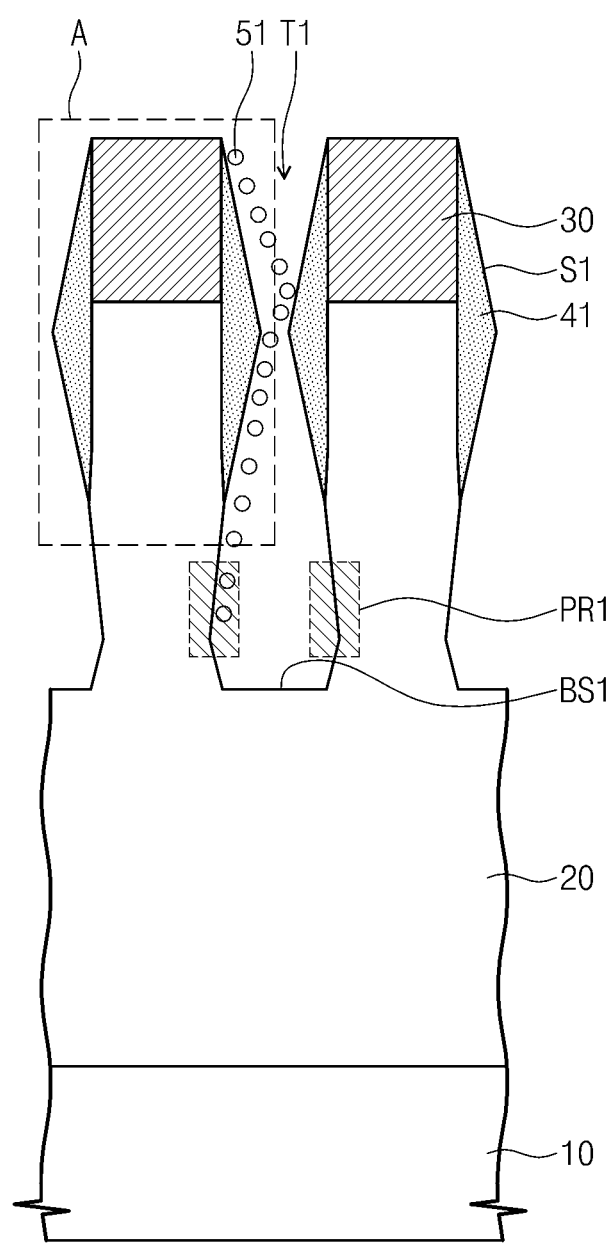
Figure 3:
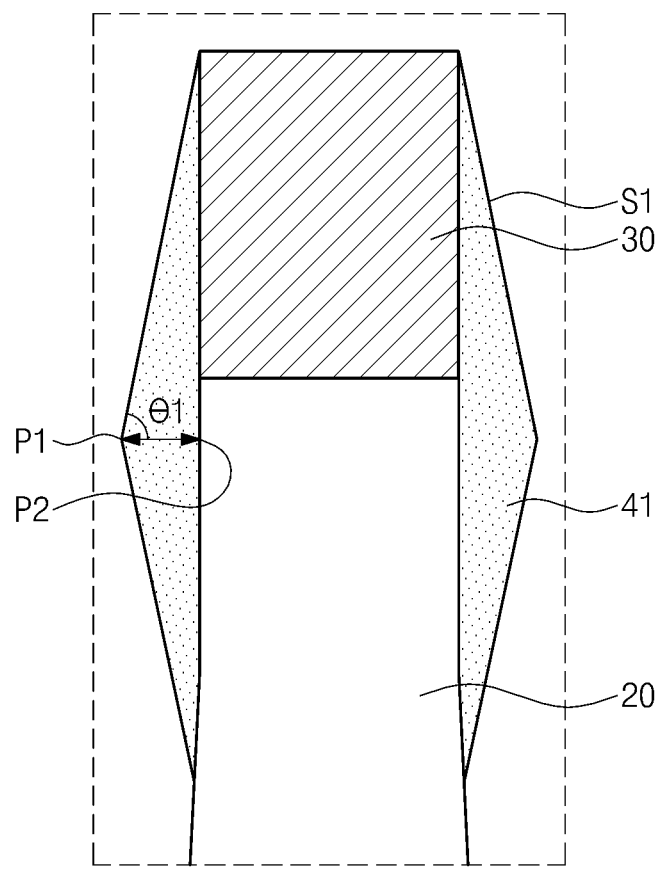
FIG. 3 is an enlarged sectional view of a portion "A" in FIG. 2.
Figure 4:
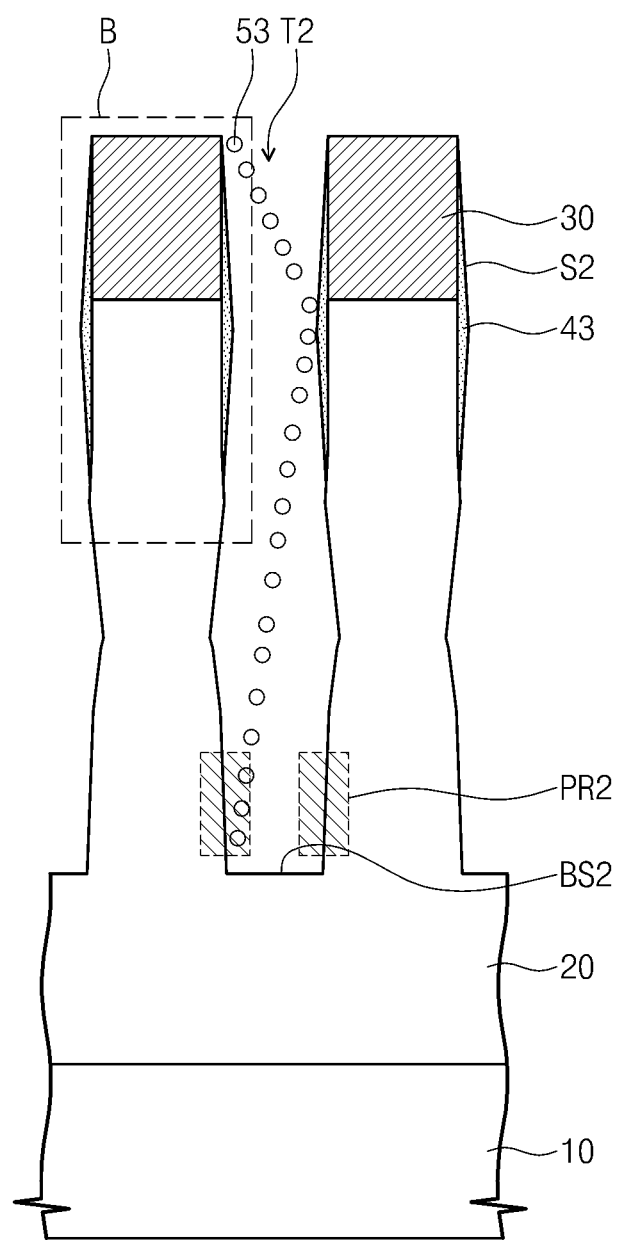
Figure 5:
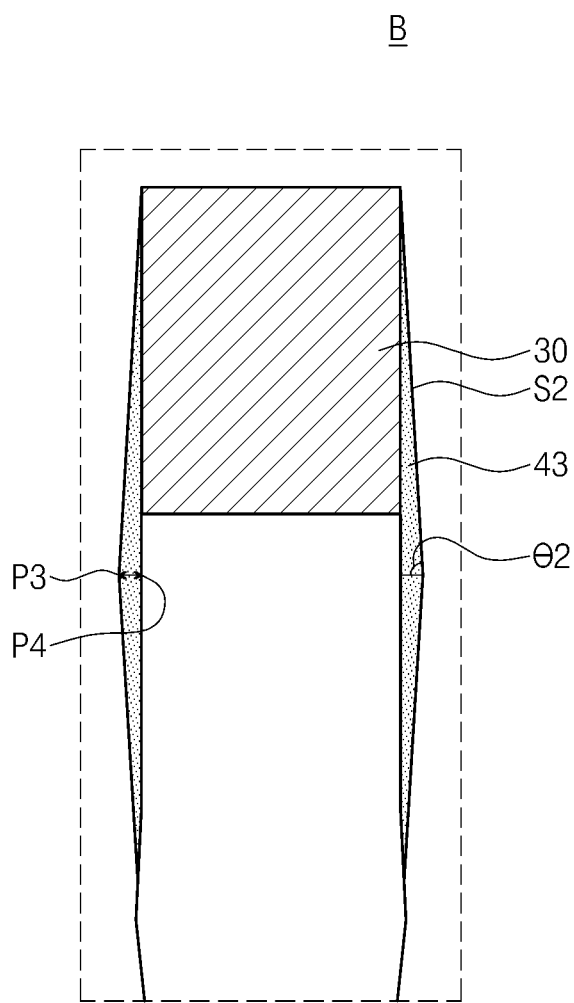
FIG. 5 is an enlarged sectional view of a portion "B" in FIG. 4.

FIGS. 1, 2, 4, 6, 7, and 9 are sectional views illustrating methods of forming a fine pattern of a semiconductor device according to example embodiments of the inventive concepts. FIG. 3 is an enlarged sectional view of a portion "A" in FIG. 2, FIG. 5 is an enlarged sectional view of a portion "B" in FIG. 4, and FIG. 8 is an enlarged sectional view of a portion "C" in FIG. 7.

Referring to FIG. 1, an etch target layer 20 may be formed on a substrate 10 and mask patterns 30 may be formed on the etch target layer 20. The substrate 10 may be a silicon wafer. The etch target layer 20 may include an insulating material (e.g., a silicon oxide layer or a silicon nitride layer). The mask patterns 30 may include at least one of metallic materials (e.g., Ti, Cr, Mo, Ta, Al, W, or Pt).

Referring to FIGS. 2 and 3, the etch target layer 20 may be etched by performing a first dry etch process using the mask patterns 30 as an etch mask to form first sub-trenches T1. Each of the first sub-trenches T1 may have a first bottom surface BS1.

The first dry etch process may be performed to form first sidewall patterns 41. For example, the first dry etch process may be performed in such a way that the first sidewall patterns 41 are formed on sidewalls of the mask patterns 30 and sidewalls of the first sub-trenches T1. The first sidewall patterns 41 may be a by-product layer, which is formed by a chemical reaction between carbon ions and etch by-products, where the carbon ions may be produced from an etching gas by plasma generated during the first dry etch process, and the etch by-products may be produced from the etch target layer 20 during the first dry etch process. Outer sidewalls S1 of the first sidewall patterns 41 may have a first angle θ1 with respect to a top surface of the substrate 10.

The first dry etch process may be performed using at least one of $C_xF_y$-based gas and $CH_xF_y$-based gas. The $C_xF_y$-based gas may be selected to have the ratio of y to x ranging from 1.5 to 4. In some embodiments, the $C_xF_y$-based gas and the $CH_xF_y$-based gas may include at least one of $C_4F_6$, $C_4F_8$, $CF_4$, $CF_3$, $CHF_3$, and $CH_2F_2$. As an example, a first gas 51 may be used in the first dry etch process. The first gas 51 may include at least one of $C_xF_y$-based gases, where the ratio of y/x is less than 2, and $CH_xF$-based gases. The first gas 51 may be at least one of, for example, $C_4F_6$, $CHF_3$, and $CH_2F_2$. The use of the first gas 51 (e.g., the $C_xF_y$-based gas (with the ratio of y/x less than 2) or $CH_xF_y$-based gas) may allow for a large amount of polymer (e.g., the etching by-products) to be produced during the first dry etch process.

Since the outer sidewalls S1 of the first sidewall patterns 41 have the first angle θ1 with respect to the top surface of the substrate 10, the first sidewall patterns 41 may allow for ions and/or radicals of the first gas 51 to be injected onto the etch target layer 20 at the first angle θ1. Accordingly, it is possible to increase a density of ions and/or radicals of the first gas 51 at lower sidewalls (e.g., first portions PR1) of the first sub-trenches T1 exposed by the first sidewall patterns 41, thereby more effectively etching the etch target layer 20.

Referring to FIG. 4, a second dry etch process may be performed to etch the etch target layer 20 exposed by or under the first sub-trenches T1, and thus, second sub-trenches T2 may be formed. The second sub-trenches T2 may be deeper than the first sub-trenches T1, when measured from a top surface of the etch target layer 20. For example, the second sub-trenches T2 may have second bottom surfaces BS2 that are positioned at a level lower than those of the first bottom surfaces BS1.

During the second dry etch process, the first sidewall patterns 41 may be deformed to form second sidewall patterns 43. The second sidewall patterns 43 may be a by-product layer, which is formed by a chemical reaction between carbon ions and etch by-products. The carbon ions may be produced from an etching gas during the second dry etch process, and the etch by-products may be produced from the etch target layer 20, when the second dry etch process is performed on the etch target layer 20. The second sidewall patterns 43 may be formed to cover the sidewalls of the mask patterns 30 and the upper and intermediate sidewalls of the second sub-trenches T2. As shown in FIG. 5, outer sidewalls S2 of the second sidewall patterns 43 may have a second angle θ2 with respect to the top surface of the substrate 10. The outer sidewalls S2 of the second sidewall patterns 43 may have a larger angle than the sidewalls S1 of the first sidewall patterns 41 with respect to the top surface of the substrate 10 (i.e., θ1<θ2). The largest horizontal width of each of the second sidewall patterns 43 may be smaller than that of a corresponding one of the first sidewall patterns 41. For example, the second sidewall pattern 43 may have a vertex P3 formed at the outer sidewall S2 and a point P4 laterally facing the vertex P3, as shown in FIG. 5, and the first sidewall pattern 41 may have a vertex P1 formed at the outer sidewall S1 and a point P2 laterally facing the vertex P1, as shown in FIG. 3, and in this case, a distance between P3 and P4 may be shorter than a distance between P1 and P2.

Referring back to FIG. 4, the second dry etch process may be performed using a $C_xF_y$-based gas. The $C_xF_y$-based gas may be selected to have the ratio of y to x ranging from 1.5 to 4. For example, the $C_xF_y$-based gas may include at least one of, for example, $C_4F_6$, $C_4F_8$, $CF_4$, and $CF_3$. In example embodiments, a second gas 53 may be used in the second dry etch process. The second gas 53 may include at least one of $C_xF_y$-based gases, where the ratio of y/x is greater than or equal to 2. The second gas 53 may be one of, for example, $C_4F_8$, $CF_4$, and $CF_3$. The use of the second gas 53 (e.g., the $C_xF_y$-based gas with the ratio of y/x greater than or equal to 2) may reduce an amount of polymer (e.g., serving as the etching by-products), compared with the case of using the first gas 51. Furthermore, in the case where the second gas 53 is used to etch the etch target layer 20, it may be possible to achieve a faster etch rate, compared with the case of using the first gas 51. By changing a kind of the etching gas based on the afore-described etching properties of the etch gases, it is possible to control the amount of the polymer produced in the etching process, and as a result, the first sidewall patterns 41 may be deformed, thereby forming the second sidewall patterns 43.

Since the outer sidewalls S2 of the second sidewall patterns 43 have the second angle θ2 with respect to the top surface of the substrate 10, ions and/or radicals of the second gas 53 may be injected to the etch target layer 20 at the second angle θ2 to etch the etch target layer 20. Accordingly, it is possible to increase a density of the ions and/or the radicals of the second gas 53 at lower sidewalls (e.g., second portions PR2) of the second sub-trenches T2, thereby more effectively etching the etch target layer 20. The second portions PR2 of the second sub-trenches T2 may be positioned at a lower level than the first portions PR1 of the first sub-trenches T1.

In some embodiments, the first and second dry etch processes may constitute the first cycle of the dry etch process.

Figure 6:
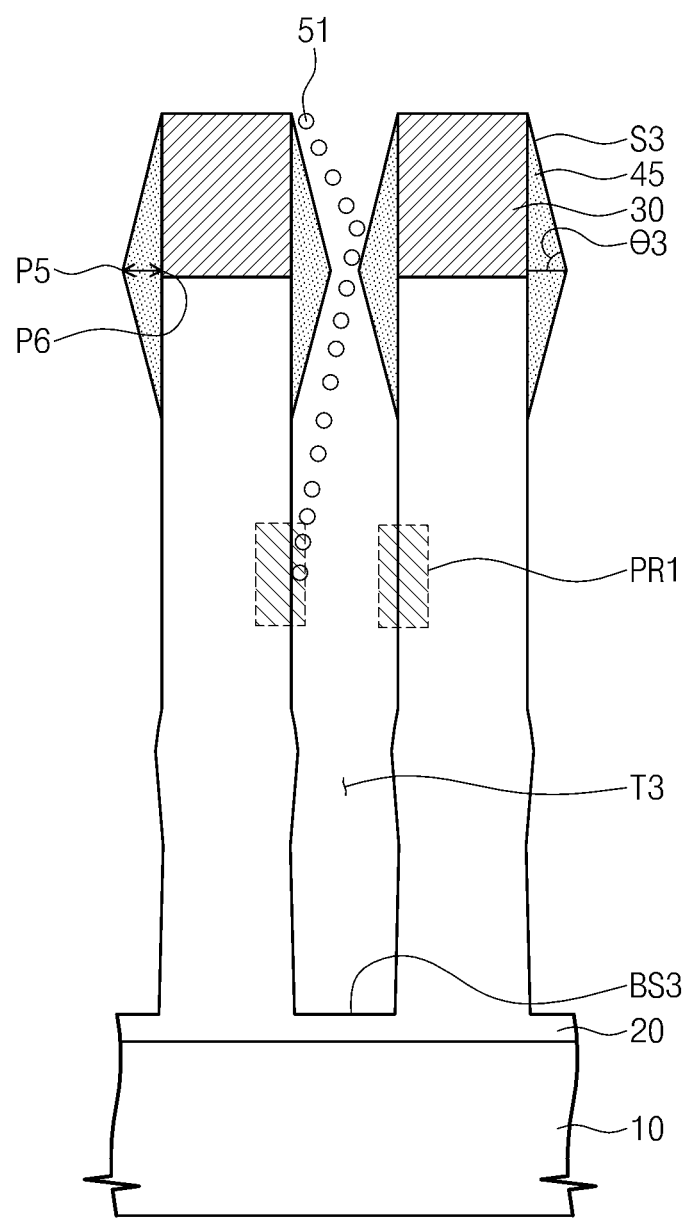

Referring to FIG. 6, a third dry etch process may be performed to etch the etch target layer 20 exposed by or under the second sub-trenches T2, and thus, third sub-trenches T3 may be formed. Third bottom surfaces BS3 of the third sub-trenches T3 may be positioned at a lower level than the second bottom surfaces BS2 of the second sub-trenches T2, described with reference to FIG. 4.

During the third dry etch process, the second sidewall patterns 43 may be deformed to form third sidewall patterns 45. The third sidewall patterns 45 may be a by-product layer, which is formed by a chemical reaction between carbon ions and etch by-products. The carbon ions may be produced from an etching gas during the third dry etch process, and the etch by-products may be produced from the etch target layer 20, when the third dry etch process is performed on the etch target layer 20. Outer sidewalls S3 of the third sidewall patterns 45 may have a third angle $\theta 3$ with respect to the top surface of the substrate 10. The outer sidewalls S3 of the third sidewall patterns 45 may have a smaller angle than the outer sidewalls S2 of the second sidewall patterns 43 (i.e., $\theta 3 < \theta 2$). The largest horizontal width of each of the third sidewall patterns 45 may be greater than that of a corresponding one of the second sidewall patterns 43. For example, as shown in FIG. 6, the third sidewall pattern 45 may have a vertex P5 formed at the outer sidewall S3 and a point P6 laterally facing the vertex P5, and in this case, a distance between P5 and P6 may be longer than the distance between P3 and P4 of the second sidewall pattern 43 shown in FIG. 5.

The third dry etch process may be performed using a $C_xF_y$-based gas. In some embodiments, a first gas 51 may be used in the third dry etch process. The first gas 51 may include at least one of $C_xF_y$-based gases, where the ratio of y/x is less than 2, and $CH_xF_y$-based gases-based gas. The first gas 51 may be at least one of, for example, $C_4F_6$, $CHF_3$, and $CH_2F_2$.

Since the outer sidewalls S3 of the third sidewall patterns 45 have the third angle $\theta 3$, ions and/or radicals of the first gas 51 may be injected to the etch target layer 20 at the third angle $\theta 3$ to etch the etch target layer 20. Accordingly, it is possible to increase a density of the ions and/or the radicals of the first gas 51 at upper sidewalls (e.g., first portions PR1) of the third sub-trenches T3, thereby more effectively etching the etch target layer 20.

Figure 7:
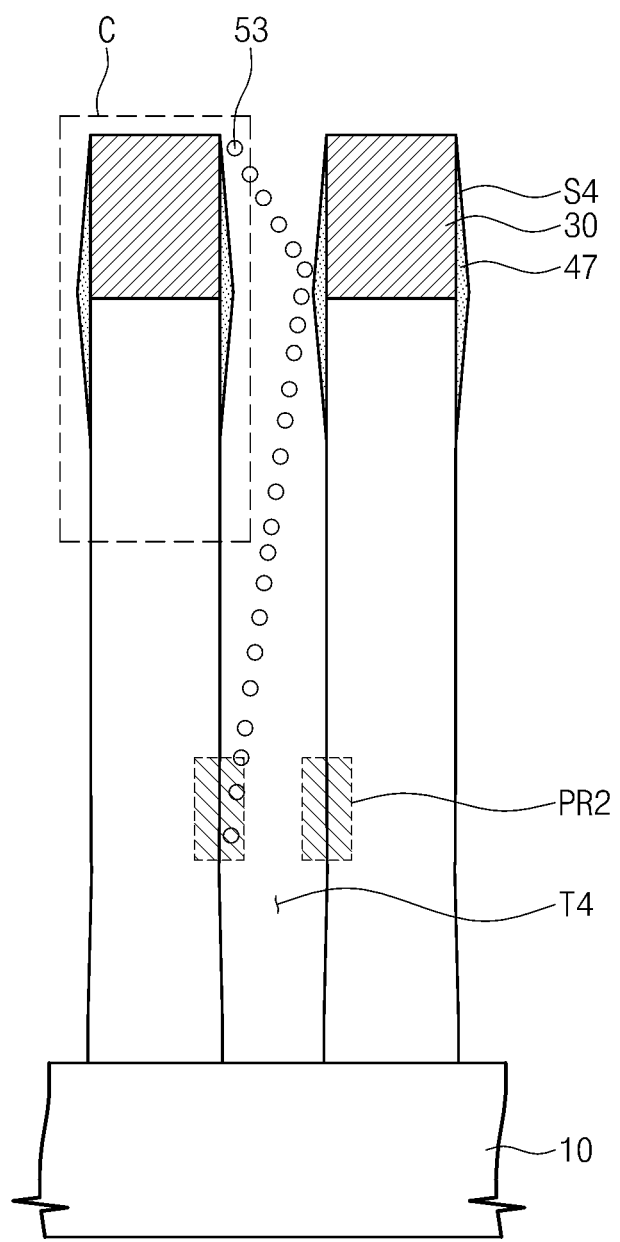
Figure 8:
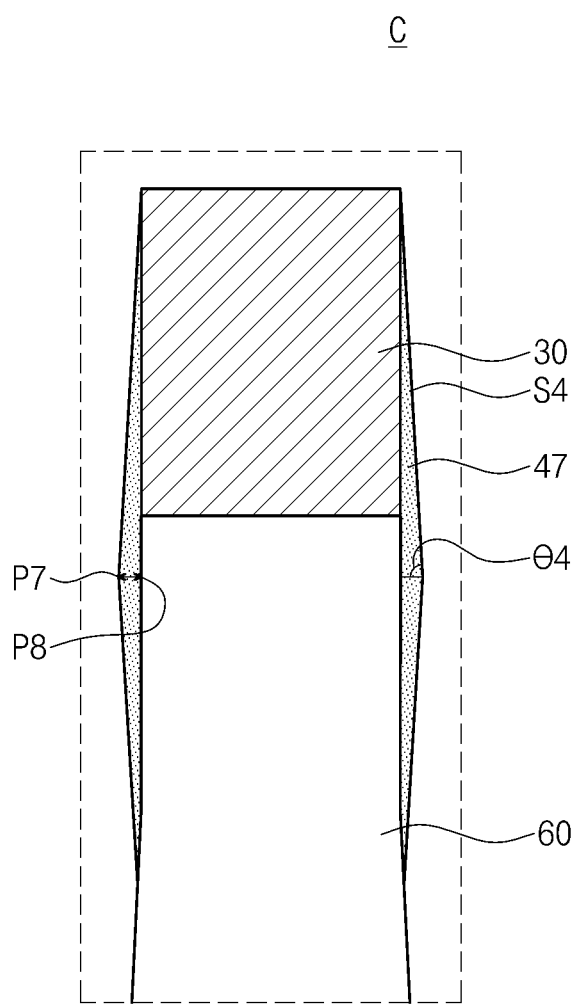
FIG. 8 is an enlarged sectional view of a portion "C" in FIG. 7.

Referring to FIG. 7, a fourth dry etch process may be performed to etch the etch target layer 20 exposed by or under the third sub-trenches T3, and thus, fourth sub-trenches T4 may be formed. The fourth sub-trench T4 may be formed to expose the substrate 10. In some embodiments, the fourth sub-trenches T4 may be formed in the etch target layer 20 in such a way not to expose the substrate 10. In certain embodiments, each of the fourth sub-trenches T4 may be formed to have a hole-shaped or line-shaped structure.

During the fourth dry etch process, the third sidewall patterns 45 may be deformed to form fourth sidewall patterns 47. The fourth sidewall patterns 47 may be a by-product layer, which is formed by a chemical reaction between carbon ions and etch by-products. The carbon ions may be produced from an etching gas during the fourth dry etch process, and the etch by-products may be produced from the etch target layer 20, when the fourth dry etch process is performed on the etch target layer 20. The fourth sidewall patterns 47 may be formed to cover the sidewalls of the mask patterns 30 and the upper and intermediate sidewalls of the fourth sub-trenches T4. As shown in FIG. 8, outer sidewalls S4 of the fourth sidewall patterns 47 may have a fourth angle $\theta 4$ with respect to the top surface of the substrate 10. The outer sidewalls of the fourth sidewall patterns 47 may have a greater angle with respect to the top surface of the substrate 10 than the outer sidewalls S3 of the third sidewall patterns 45 (i.e., $\theta 3 < \theta 4$). The largest horizontal width of each of the fourth sidewall patterns 47 may be smaller than those of the first and third sidewall patterns 41 and 45 shown in FIGS. 3 and 6. For example, as shown in FIG. 8, the fourth sidewall pattern 47 may have a vertex P7 formed at the outer sidewall S4 and a point P8 laterally facing the vertex P7, and in this case, a distance between P7 and P8 may be shorter than corresponding distances of the first and third sidewall patterns 41 and 45 shown in FIGS. 3 and 6.

Returning to FIG. 7, the fourth dry etch process may be performed using a $C_xF_y$-based gas. In some embodiments, the second gas 53 may be used in the fourth dry etch process. The second gas 53 may include at least one of CxFy-based gases, where the ratio of y/x is greater than or equal to 2. For example, the second gas 53 may be one of $C_4F_8$, $CF_4$, and $CF_3$.

Since the outer sidewalls S4 of the fourth sidewall patterns 47 have the fourth angle $\theta 4$ with respect to the top surface of the substrate 10, ions and/or radicals of the second gas 53 may be injected to the etch target layer 20 the fourth angle $\theta 4$ to etch the etch target layer 20. Accordingly, it is possible to increase a density of the ions and/or the radicals of the second gas 53 at lower sidewalls (e.g., second portions PR2) of the fourth sub-trenches T4, thereby more effectively etching the second portions PR2 of the etch target layer 20. The second portions PR2 of the fourth sub-trenches T4 may be positioned at a lower level than the first portions PR1 of the third sub-trenches T3.

In some embodiments, the third and fourth dry etch processes may constitute the second cycle of the dry etch process. Although the dry etch process with two cycles is exemplarily described above, the dry etch process may include two or more cycles, each of which is performed in the manner similar to the first and/or second cycle. In certain embodiments, the third dry etch process may be performed under the substantially same or similar process condition as the first dry etch process, and the fourth dry etch process may be performed under the substantially same or similar process condition as the second dry etch process.

A hard mask including silicon or amorphous carbon has been used to form patterns in a semiconductor device. However, to meet an increasing demand for patterns with a high aspect ratio, a silicon-based or carbon-based mask needs to have an increased height. A metal-based hard mask is regarded as an alternative to the silicon- or carbon-based mask. However, since the metal-based hard mask has a high etch selectivity with respect to an etch target layer, it may exhibit a small etch loss, when an etch target layer is etched. Accordingly, in the case where an etching process is performed using the metal-based hard mask, a portion of a sidewall of a pattern may be intensively etched by an etch gas guided by the hard mask etch, and this may lead to a bowing phenomenon at an upper portion of the pattern.

According to example embodiments of the inventive concepts, by changing the type of an etch gas during an etch process, it is possible for the first to fourth sidewall patterns 41, 43, 45, and 47 to have different sidewall angles. In the case where the first to fourth sidewall patterns 41, 43, 45, and 47 have small sidewall angles, ions and radicals of the etch gas may be more intensively injected to the upper sidewalls of the sub-trenches T1, T2, T3, and T4, rather than to the lower sidewalls, during the dry etching process. In the case where the first to fourth sidewall patterns 41, 43, 45, and 47 have large sidewall angles, the ions and radicals of the etch gas may be more intensively injected to the lower sidewalls of the sub-trenches T1, T2, T3, and T4, rather than to the upper sidewalls, during the dry etching process. Accordingly, by adaptively or repeatedly changing the sidewall angels of the first to fourth sidewall patterns 41, 43, 45, and 47, it is possible to reduce or prevent the ions and radicals of the etch gas from colliding with only a specific portion of the sub-trenches T1, T2, T3, and T4. That is, it is possible to adaptively change a collision position of the ions and radicals of the etch gas to be injected to the sidewalls of the sub-trenches T1, T2, T3, and T4, and this may make it possible for the fourth sub-trenches T4 to have a vertical sidewall.

Figure 9:
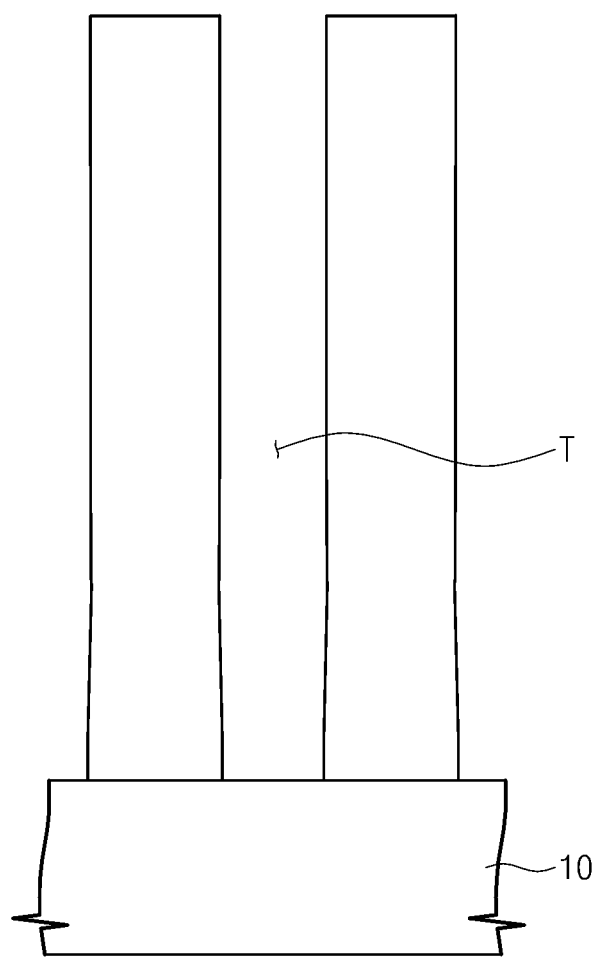

Referring to FIG. 9, after the formation of the fourth sub-trenches T4, the mask patterns 30 and the fourth sidewall patterns 47 may be removed to form trenches T. The mask patterns 30 may be removed by an etch-back process or a chemical mechanical polishing (CMP) process. The fourth sidewall patterns 47 may be removed by an ashing process. The trenches T may be formed in or through the etch target layer 20. The trenches T may be formed to have a substantially vertical section, without the bowing phenomenon. Furthermore, this may make it possible for fine patterns defined by the trenches T to have an improved profile.

FIGS. 10 to 16 are sectional views illustrating methods of forming a fine pattern of a semiconductor device, according to example embodiments of inventive concepts. For concise description, an element previously described with reference to FIGS. 1 to 9 may be identified by a similar or identical reference number without repeating an overlapping description thereof.

Figure 10:
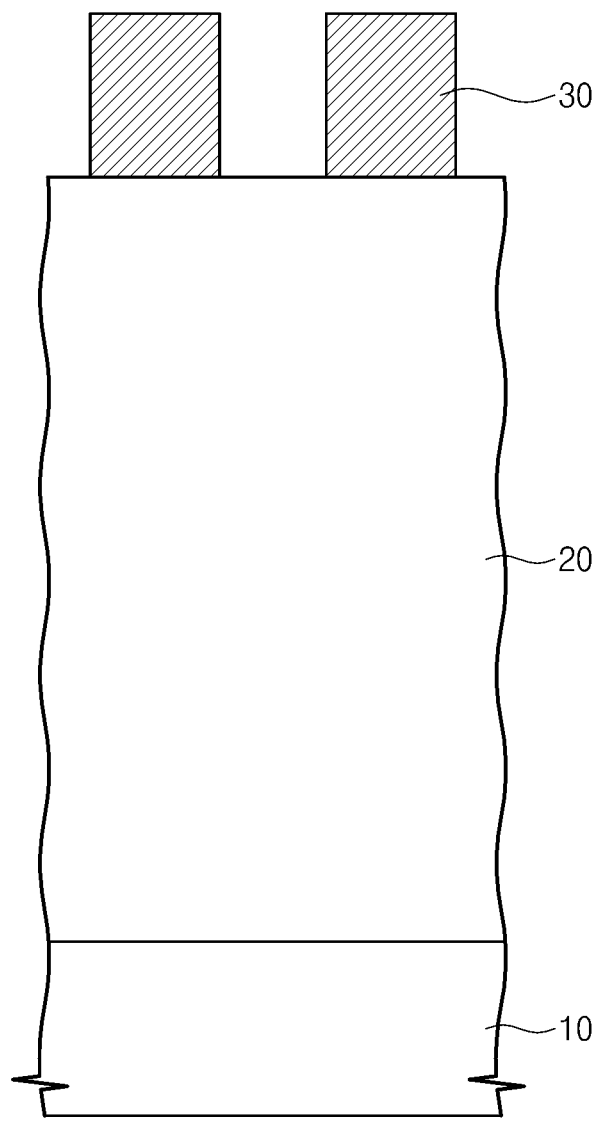
FIGS. 10 to 16 are sectional views illustrating methods of forming a fine pattern of a semiconductor device, according to example embodiments of the inventive concepts.

Referring to FIG. 10, an etch target layer 20 may be formed on a substrate 10 and mask patterns 30 may be formed on the etch target layer 20. In some embodiments, the substrate 10 may be a silicon wafer. The etch target layer 20 may be formed of or include a silicon oxide layer or a silicon nitride layer. The mask patterns 30 may include at least one of metallic materials (e.g., Ti, Cr, Mo, Ta, Al, W, or Pt).

Figure 11:
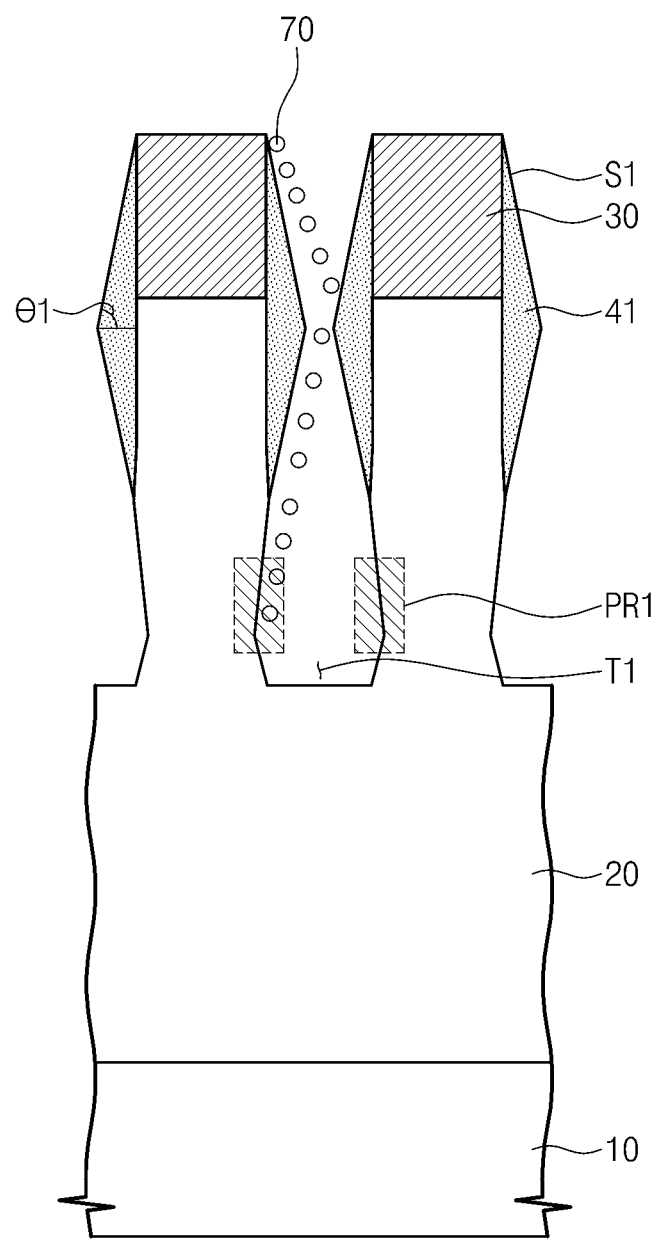

Referring to FIG. 11, the etch target layer 20 may be etched by a first dry etch process using the mask patterns 30 as an etch mask to form first sub-trenches T1.

The first dry etch process may be performed to form first sidewall patterns 41. For example, the first dry etch process may be performed in such a way that the first sidewall patterns 41 are formed on sidewalls of the mask patterns 30 and sidewalls of the first sub-trenches T1. The first sidewall patterns 41 may be a by-product layer, which is formed by a chemical reaction between carbon ions and etch by-products, where the carbon ions may be produced from an etching gas by plasma generated during the first dry etch process, and the etch by-products may be produced from the etch target layer 20 during the first dry etch process. Outer sidewalls S1 of the first sidewall patterns 41 may have a first angle θ1 with respect to the top surface of the substrate 10.

The first dry etch process may be performed using an etch gas 70. The etch gas 70 may be at least one of $C_xF_y$- and $CH_xF_y$-based gases. For example, the etch gas 70 may include at least one of $C_4F_6$, $C_4F_8$, $CF_4$, $CF_3$, $CHF_3$, and $CH_2F_2$.

Since the outer sidewalls S1 of the first sidewall patterns 41 have the first angle θ1 with respect to the top surface of the substrate 10, ions and/or radicals of the etch gas 70 may be injected to the etch target layer 20 at the first angle θ1 to etch the etch target layer 20. Accordingly, it is possible to increase a density of the ions and/or the radicals of the etch gas 70 at lower sidewalls (e.g., first portions PR1) of the first sub-trenches T1 exposed by the first sidewall patterns 41, thereby more effectively etching the etch target layer 20.

Figure 12:
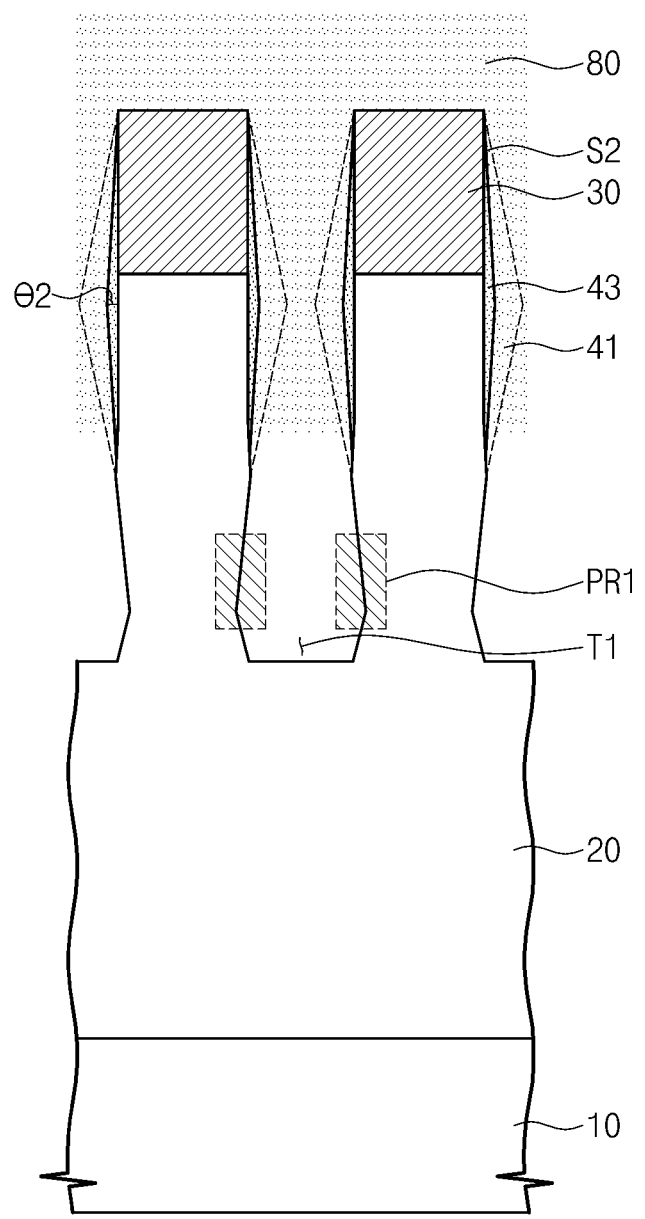

Referring to FIGS. 12 to 15, a second dry etch process may be performed to etch the etch target layer 20 exposed by or under the first sub-trenches T1, and thus, second sub-trenches T2 may be formed. During the second dry etch process, the first sidewall patterns 41 may be deformed to form second sidewall patterns 43. The second sidewall patterns 43 may be a by-product layer, which is formed by a chemical reaction between ions and etch by-products. The carbon ions may be produced from an etching gas during the second dry etch process, and the etch by-products may be produced from the etch target layer 20, when the second dry etch process is performed on the etch target layer 20. Outer sidewalls S2 of the second sidewall patterns 43 may have a second angle θ2 with respect to the top surface of the substrate 10, as shown in FIG. 12. The sidewalls S2 of the second sidewall patterns 43 may have a greater angle with respect to the top surface of the substrate 10 than the sidewalls S1 of the first sidewall patterns 41 (i.e., θ1<θ2).

The second dry etch process may be performed using an etch gas 70. The etch gas 70 may include at least one of, for example, $C_4F_6$, $C_4F_8$, $CF_4$, $CF_3$, $CHF_3$, and $CH_2F_2$.

Figure 13:
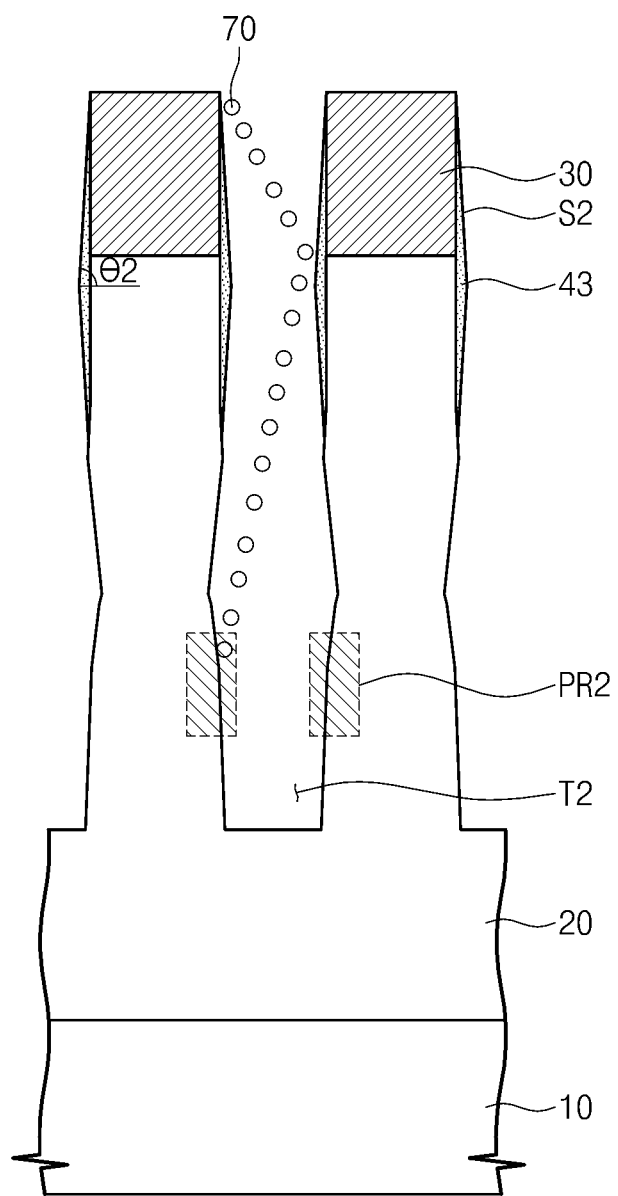

According to example embodiments of inventive concepts, as shown in FIGS. 12 and 13, the second dry etch process may include generating additional plasma 80, before etching the etch target layer 20. Ions included in the additional plasma 80 may be reacted with carbon atoms of the first sidewall patterns 41, and thus, the first sidewall patterns 41 may be deformed to form the second sidewall patterns 43. The additional plasma 80 may be, for example, $O_2$ plasma or $NF_3$ plasma. In the case where $O_2$ plasma is used, $O_2$ ions may be combined with the carbon atoms of the first sidewall patterns 41. In the case where $NF_3$ plasma is used, $NF_3$ ions may be combined with the carbon atoms of the first sidewall patterns 41.

An etch process for etching the etch target layer 20 may be performed using the second sidewall patterns 43 as an etch mask. Since the outer sidewalls S2 of the second sidewall patterns 43 may have the second angle θ2, ions and/or radicals of the etch gas 70 may be injected to the etch target layer 20 at the second angle θ2 to etch the etch target layer 20. This may make it possible to increase a density of the ions and/or radicals of the etch gas 70 at lower sidewalls (e.g., second portions PR2) of the second sub-trenches T2, and as a result, it is possible to more effectively etch the second portions PR2 of the etch target layer 20.

The second dry etch process may be performed to allow for the second sidewall patterns 43 to be gradually deformed to have a similar shape to the first sidewall patterns 41 or to gradually change an injection angle of the etch gas 70 from the second angle θ2 to the first angle θ1.

Figure 14:
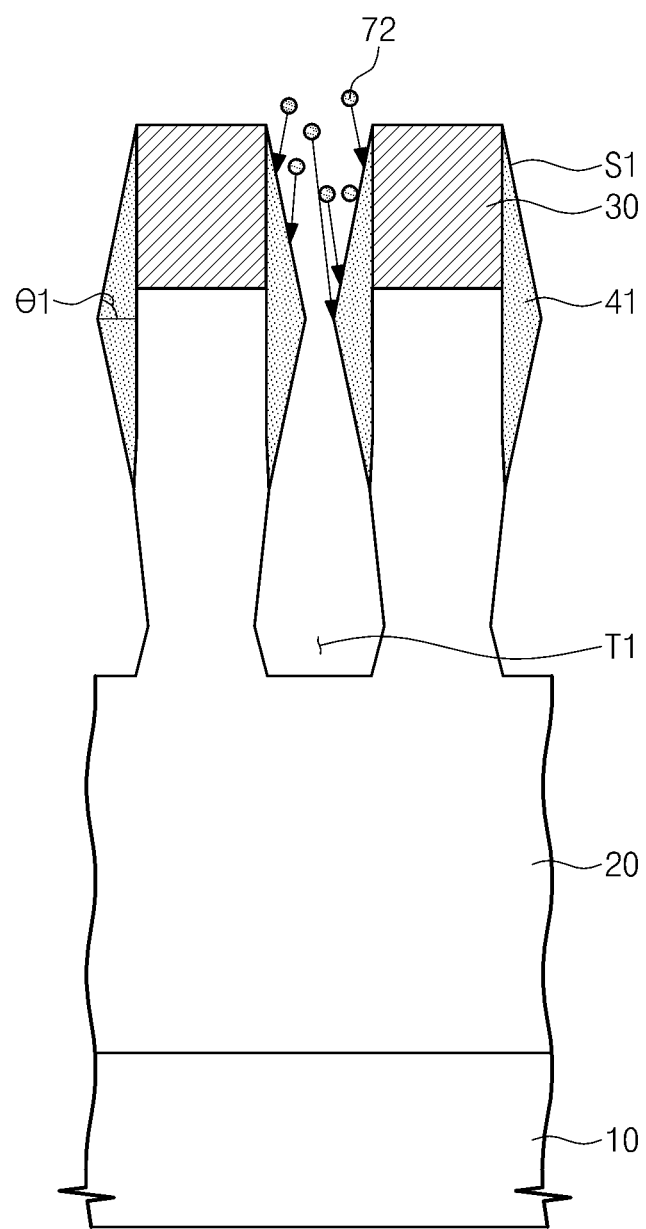
Figure 15:
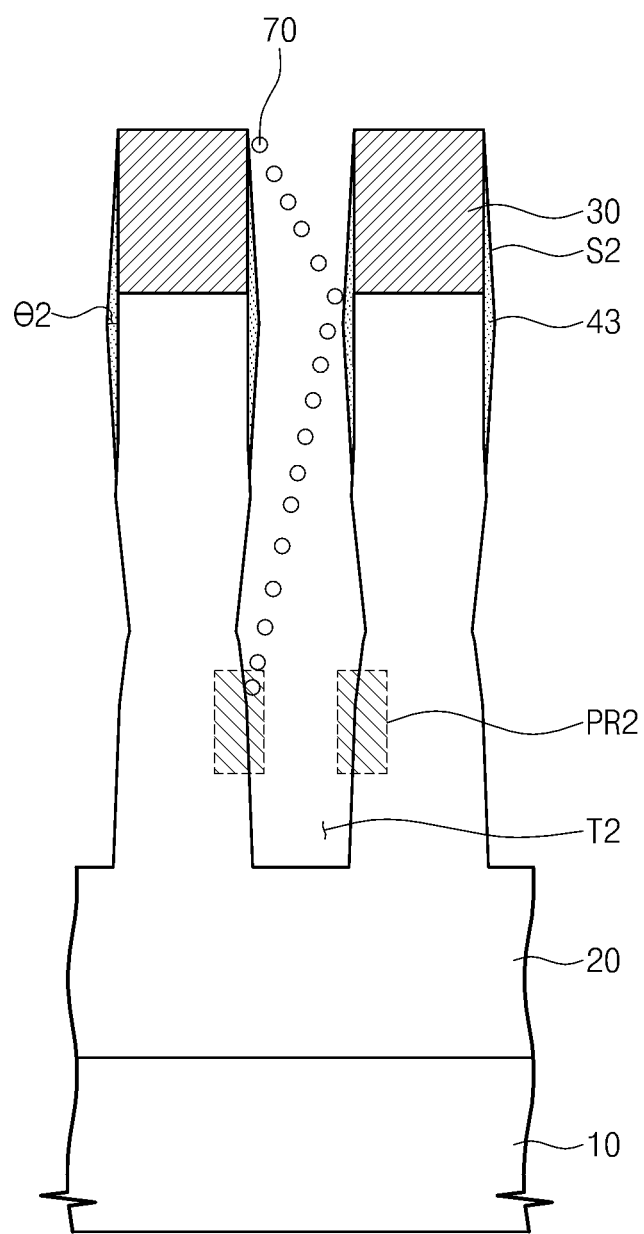

Referring to FIGS. 14 and 15, the second dry etch process may further include supplying an additional etch gas 72, before the etching of the etch target layer 20. The additional etch gas 72 may include an argon (Ar) gas. The additional etch gas 72 may be used to physically etch the first sidewall patterns 41. As a result of such a physical etching process, the first sidewall patterns 41 may be deformed to form second sidewall patterns 43.

Since the outer sidewalls S2 of the second sidewall patterns 43 have the second angle θ2 with respect to the top surface of the substrate 10, ions and/or radicals of the etch gas 70 may be injected to the etch target layer 20 at the second angle θ2 to etch the etch target layer 20. This may make it possible to increase a density of the ions and/or radicals of the etch gas 70 at lower sidewalls (e.g., second portions PR2) of the second sub-trenches T2, and thus, it is possible to more effectively etch the second portions PR2 of the etch target layer 20. In some embodiments, the second portions PR2 of the second sub-trenches T2 may be positioned at a lower level than the first portions PR1 of the first sub-trenches T1.

In some embodiments, the first and second dry etch processes may constitute the first cycle of the dry etch process. In certain embodiments, the first and/or second cycles may be repeated two or more times during the dry etch process (for example, until the trenches T are formed).

Figure 16:
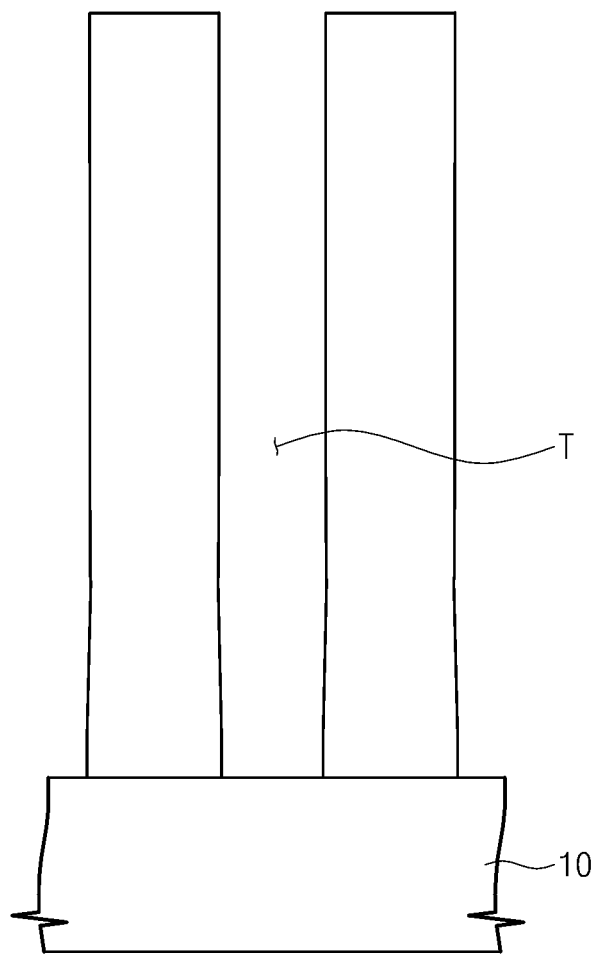

Referring to FIG. 16, the mask patterns 30 and the second sidewall patterns 43 may be removed to form trenches T. The trenches T may be formed to have a substantially vertical section, without the bowing phenomenon.

Figure 17:
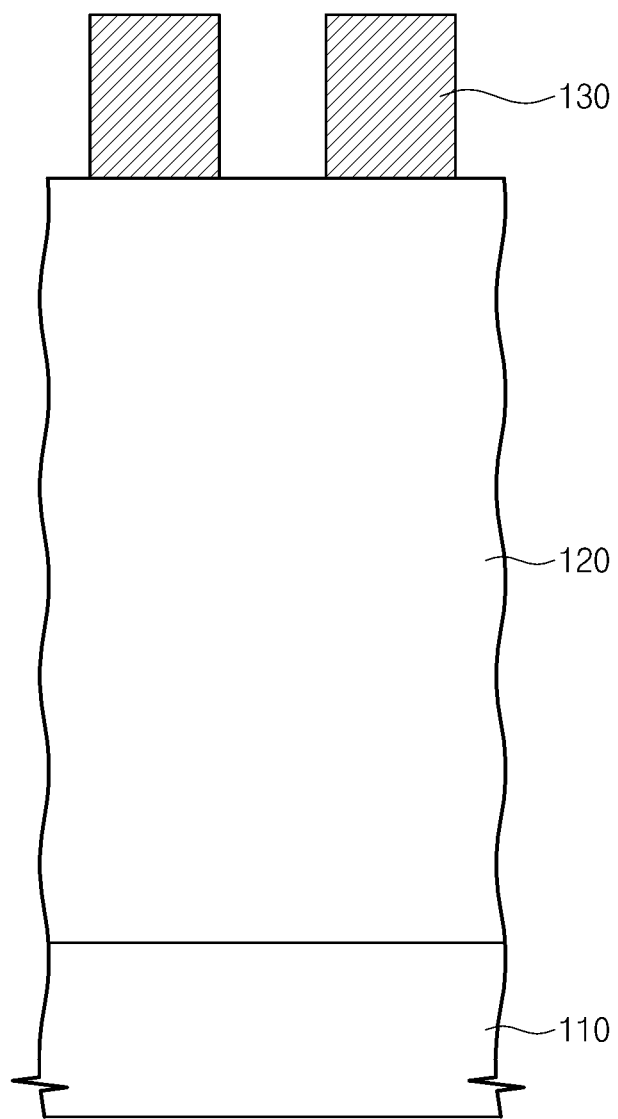
FIGS. 17, 18, 20, and 22 are sectional views illustrating methods of forming a fine pattern of a semiconductor device, according to example embodiments of the inventive concepts.
Figure 18:
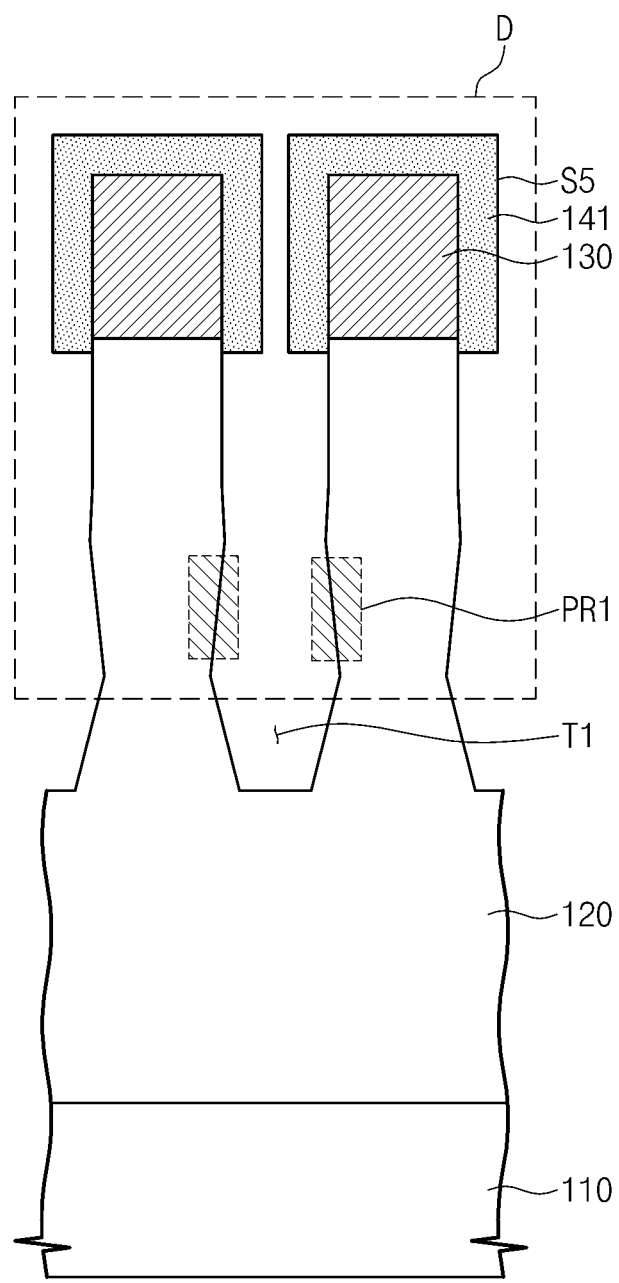
Figure 19:
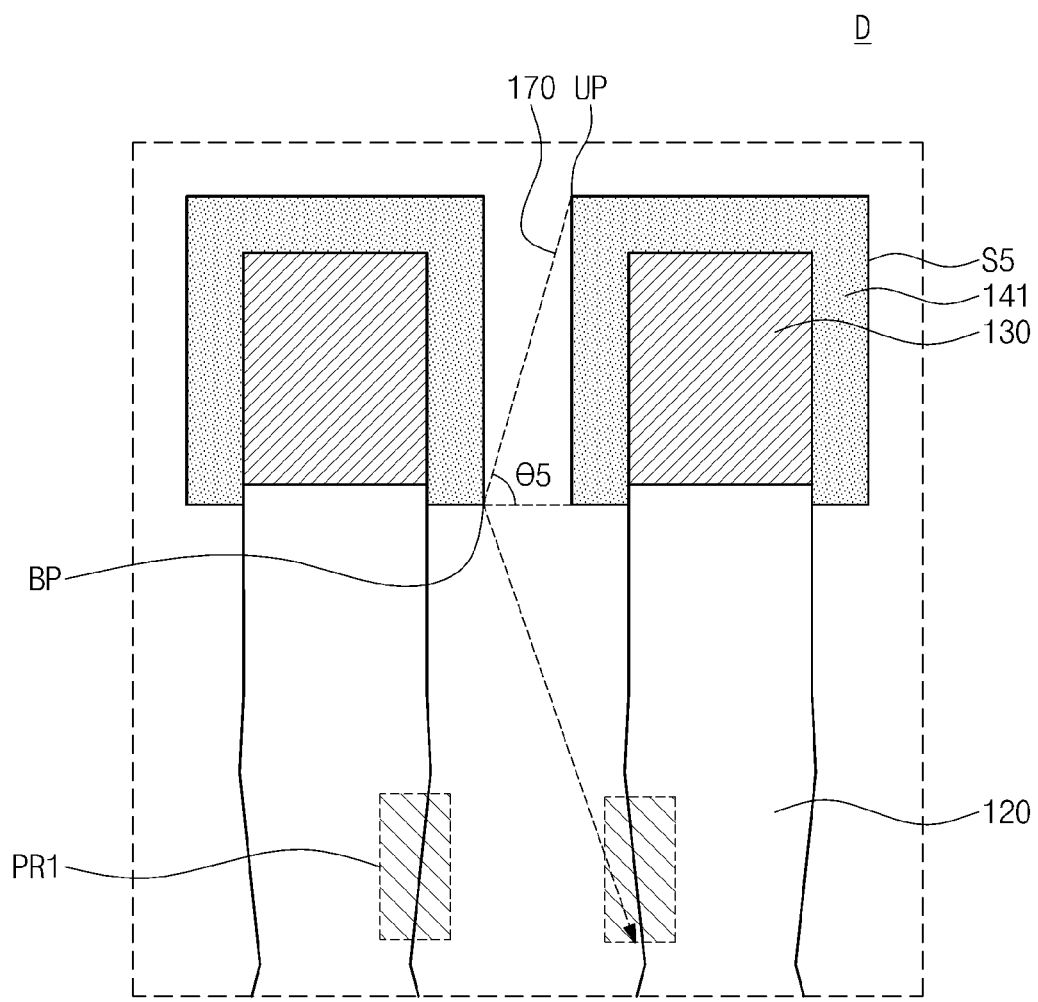
FIG. 19 is an enlarged sectional view of a portion "D" in FIG. 18.

FIGS. 17, 18, 20, and 22 are sectional views illustrating methods of forming a fine pattern of a semiconductor device, according to example embodiments of the inventive concepts. FIG. 19 is an enlarged sectional view of a portion "D" in FIG. 18, and FIG. 21 is an enlarged sectional view of a portion "E" in FIG. 20. For concise description, an element previously described with reference to FIGS. 1 to 9 may be identified by a similar or identical reference number without repeating an overlapping description thereof.

Referring to FIG. 17, an etch target layer 120 may be formed on a substrate 110, and mask patterns 130 may be formed on the etch target layer 120. The substrate 110 may be a silicon wafer. The etch target layer 120 may be formed of or include a silicon oxide layer or a silicon nitride layer. The mask patterns 130 may include at least one of metallic materials (e.g., Ti, Cr, Mo, Ta, Al, W, or Pt).

Referring to FIGS. 18 and 19, the etch target layer 120 may be etched by performing a first dry etch process using the mask patterns 130 as an etch mask to form first sub-trenches T1.

First sidewall patterns 141 may be formed during the first dry etch process. The first sidewall patterns 141 may be a by-product layer formed by a chemical reaction between carbon ions and etch by-products, where the carbon ions may be produced from an etching gas by plasma generated during the first dry etch process, and the etch by-products may be produced from the etch target layer 120 during the first dry etch process. The first sidewall patterns 141 may be formed to conformally cover top and side surfaces of the mask patterns 130 and sidewalls of the first sub-trenches T1. In some embodiments, outer sidewalls S5 of the first sidewall patterns 141 may be substantially perpendicular to a top surface of the substrate 110.

The first dry etch process may be performed using an etch gas 170. The etch gas 170 may be or include at least one of, for example, a $C_xF_y$-based gas and a $CH_xF_y$-based gas. The etch gas 170 may include at least one of, for example, $C_4F_6$, $C_4F_8$, $CF_4$, $CF_3$, $CHF_3$, and $CH_2F_2$.

The first dry etch process may be performed using the etch gas 170 having a lowered electron temperature. As an example, a xenon (Xe) gas may be provided to lower the electron temperature of the etch gas 170. Electrons in the xenon (Xe) gas may be easily released from the bound state to be free electrons. The free electrons released from the xenon (Xe) gas may be combined with ions of the etch gas 170 to suppress ionization or dissociation of the etch gas 170. In certain embodiments, in order to lower the electron temperature of the etch gas 170, an etch process may be performed with a reduced plasma source power. In the case where the plasma source power is reduced, it may be possible to suppress ionization or dissociation of the etch gas 170.

If the etch gas 170 is not ionized or dissociated, it may be heavy in weight. In this case, as a result of a chemical reaction between the heavy etch gas 170 and etch by-products, a by-product layer may be locally deposited on the mask patterns 130 and on upper sidewalls of the first trenches T1. For example, first sidewall patterns 141 may be formed to conformally cover a portion of the upper sidewalls of the first sub-trenches T1.

Ions and/or radicals of the etch gas 170 may be injected to the etch target layer 120 at a fifth angle θ5 to etch the etch target layer 120. Here, as shown in FIG. 19, the fifth angle θ5 may be an angle of a diagonal line connecting upper and lower points UP and BP of an adjacent pair of the first sidewall patterns 141, with respect to the top surface of the substrate 110, where the upper point UP may be defined as a point where top and side surfaces of one of the adjacent pair of the first sidewall patterns 141 meet each other and the lower point BP may be defined as a point where bottom and side surfaces of the other of the adjacent pair of the first sidewall patterns 141 meet each other.

Since the outer sidewalls S5 of the first sidewall patterns 141 have the fifth angle θ5 with respect to the top surface of the substrate 110, ions and/or radicals of the etch gas 170 may be injected to the etch target layer 120 at the fifth angle θ5 to etch the etch target layer 120. Accordingly, it is possible to increase a density of the ions and/or the radicals of the etch gas 170 at lower sidewalls (e.g., first portions PR1) of the first sub-trenches T1 exposed by the first sidewall patterns 141, and this makes it possible to more effectively etch the first portions PR1 of the etch target layer 120.

Figure 20:
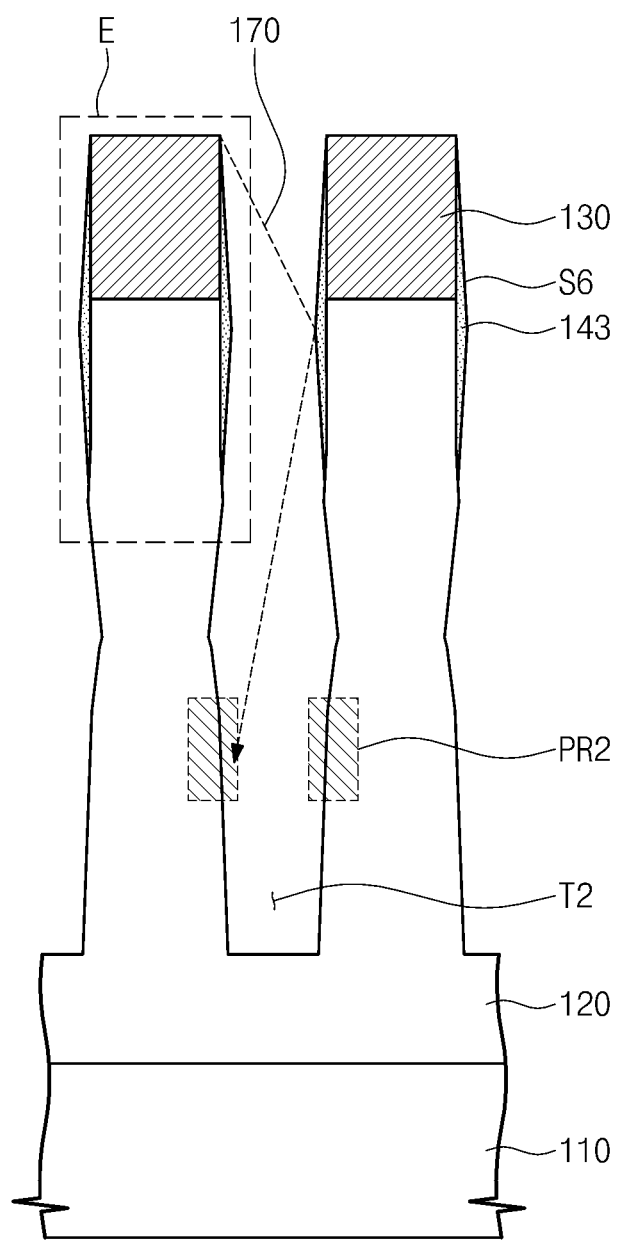
Figure 21:
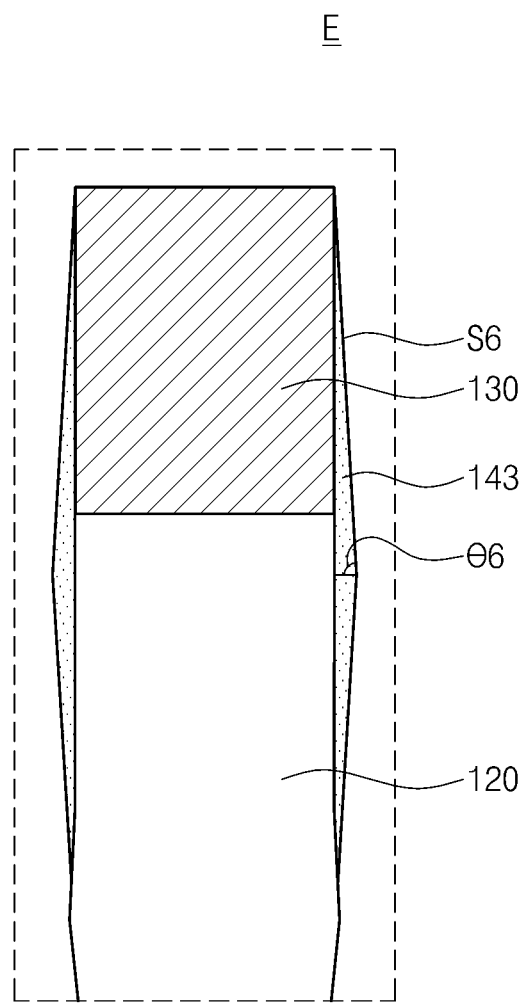
FIG. 21 is an enlarged sectional view of a portion "E" in FIG. 20.

Referring to FIGS. 20 and 21, a second dry etch process may be performed to etch the etch target layer 120 exposed by or under the first sub-trenches T1, and thus, second sub-trenches T2 may be formed. During the second dry etch process, the first sidewall patterns 141 may be deformed to form second sidewall patterns 143. The second sidewall patterns 143 may be a by-product layer, which is formed by a chemical reaction between carbon ions and etch by-products, where the carbon ions may be produced from the etching gas under a process condition different from that of the first etch process and the etch by-products may be produced from the etch target layer 120 during the second dry etch process.

Sidewalls S6 of the second sidewall patterns 143 may have a sixth angle θ6 with respect to a top surface of the substrate 110. Outer sidewalls S6 of the second sidewall patterns 143 may have a smaller angle with respect to the top surface of the substrate 110 than the outer sidewalls S5 of the first sidewall patterns 141 (i.e., θ6<90°.

The second dry etch process may be performed using an etch gas 170. The etch gas 170 may include at least one of, for example, a $C_xF_y$-based gas and a $CH_xF_y$-based gas. The etch gas 170 may include at least one of, for example, $C_4F_6$, $C_4F_8$, $CF_4$, $CF_3$, $CHF_3$, and $CH_2F_2$.

The second dry etch process may be performed using the etch gas 170, whose electron temperature is higher than that in the first etch process. As an example, to achieve the higher electron temperature of the etch gas 170, the xenon (Xe) gas may not be supplied during the second dry etch process. In this case, it may be possible to more easily dissociate or ionize the etch gas 170, compared with the case where the xenon (Xe) gas is provided. As another example, the second dry etch process may be performed with an increased plasma source power. The increase of the plasma source power may make it possible to increase the electron temperature of the etch gas 170 and more easily ionize or dissociate of the etch gas 170. For example, a $C_4F_6$ gas may be dissociated into a $CF_2$ gas and a $CF_4$ gas. The $CF_2$ gas and the $CF_4$ gas after the dissociation may be lighter in weight than the $C_4F_6$ gas before the dissociation. Furthermore, as a result of the dissociation of the etch gas 170, $C_xF_y$ gases with at least two different y/x ratio may coexist. In this case, a polymer layer may also be deposited on upper sidewalls of the second sub-trenches T2, as a result of a chemical reaction between ions of the dissociated etch gas 170 and the etch by-products of the etch target layer 120.

Since the outer sidewalls S6 of the second sidewall patterns 143 have the sixth angle θ6 with respect to the top surface of the substrate 110, ions and/or radicals of the etch gas 170 may be injected to the etch target layer 120 at the sixth angle θ6 to etch the etch target layer 120. The sixth angle θ6 in the second etch process may be greater than the fifth angle θ5 in the first etch process (i.e., θ5<θ6). Accordingly, it is possible to increase a density of the ions and/or radicals of the etch gas 170 at lower sidewalls (e.g., second portions PR2) of the second sub-trenches T2, and this makes it possible to more effectively etch the second portions PR2 of the etch target layer 120. The second portions PR2 of the second sub-trenches T2 may be positioned at a lower level than the first portions PR1 of the first sub-trenches T1.

In some embodiments, the first and second dry etch processes may constitute the first cycle of the dry etch process. In certain embodiments, the first and/or second cycles may be repeated two or more times during the dry etch process (for example, until the trenches T are formed).

Figure 22:
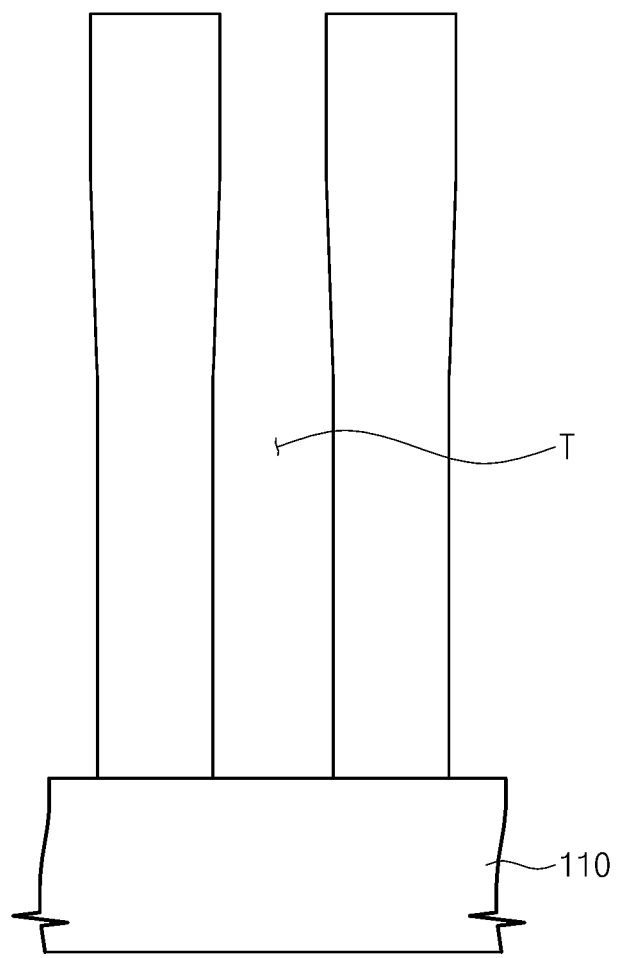

Referring to FIG. 22, after the second dry etch process is performed to form the second sub-trenches T2, the mask patterns 130 and the second sidewall patterns 143 may be removed to form trenches T. The trenches T may be formed to have a substantially vertical section, without the bowing phenomenon.

According to example embodiments of inventive concepts, an etch process may include at least two etch steps, which are sequentially performed to etch an etch target layer, and each of which is performed using a respective sidewall pattern. The sidewall pattern may be formed of or include a by-product layer produced in the corresponding etch step. The at least two etch steps may be performed under different process conditions. Thus, it is possible to change sidewall angles of the sidewall patterns, thereby changing a propagation path of an etch gas. This may make it possible for patterns or trench to have an improved profile and a smaller width.

The above-disclosed subject matter is to be considered illustrative, and not restrictive, and the appended claims are intended to cover all such modifications, enhancements, and other features, which fall within the true spirit and scope of inventive concepts. Thus, to the maximum extent allowed by law, the scope of inventive concepts is to be determined by the broadest permissible interpretation of the following claims and their equivalents, and shall not be restricted or limited by the foregoing detailed description. While some example embodiments have been particularly shown and described, it will be understood by one of ordinary skill in the art that variations in form and detail may be made therein without departing from the spirit and scope of the claims.

What is claimed is:

1. A method of fabricating a semiconductor device, the method comprising:
   forming an etch target layer on a substrate;
   forming a mask pattern on the etch target layer;
   performing a first etch process to etch the etch target layer and form a first sub-trench, the mask pattern and a first sidewall pattern formed on a sidewall of the mask pattern being used as a first etch mask in the first etch process; and
   performing a second etch process to further etch the etch target layer under the first sub-trench and form a second sub-trench, the mask pattern and a second sidewall pattern formed on the sidewall of the mask pattern being used as a second etch mask in the second etch process,
   wherein the second etch process is performed to change a first angle of a first outer sidewall of the first sidewall pattern with respect to a top surface of the substrate to form a second outer sidewall of the second sidewall pattern having a second angle different from the first angle with respect to the top surface of the substrate.

2. The method of claim 1, wherein the first angle is smaller than the second angle.

3. The method of claim 1, wherein the first sidewall pattern is formed to conformally cover an upper surface and a side surface of the mask pattern,
   the first sidewall pattern is formed in such a way that the first outer sidewall of the first sidewall pattern is substantially perpendicular to the top surface of the substrate, and
   the second sidewall pattern is formed in such a way that the second outer sidewall of the second sidewall pattern is slanted at an angle to the top surface of the substrate.

4. The method of claim 1, wherein the first etch process and the second etch process are performed using a first etch gas and a second etch gas, respectively,
   the first sidewall pattern is a first by-product layer that is formed based on a first chemical reaction between a first carbon ion of the first etch gas and a first by-product of the etch target layer, and
   the second sidewall pattern is a second by-product layer that is formed based on a second chemical reaction between a second carbon ion of the second etch gas and a second by-product of the etch target layer.

5. The method of claim 1, wherein the first etch process and the second etch process are performed using a first etch gas and a second etch gas, respectively,
   the first etch gas is at least one of $C_xF_y$-based gases, where a ratio of y to x ranges from 0 to 2, and $CH_xF_y$-based gases, and
   the second etch gas is another at least one of $C_xF_y$-based gases, where the ratio of y to x ranges from 2 to 4.

6. The method of claim 5, wherein the first etch gas is at least one of $C_4F_6$, $CHF_3$, and $CH_2F_2$, and the second etch gas is at least one of $C_4F_8$, $CF_4$, and $CF_3$.

7. The method of claim 1, wherein the second sidewall pattern is formed by providing an $O_2$ plasma or a $NF_3$ plasma to the first sidewall pattern.

8. The method of claim 1, wherein an inert gas is provided during the second etch process, not during the first etch process.

9. The method of claim 1, wherein the first etch process and the second etch process are performed using a first etch gas and a second etch gas, respectively, and the first etch process is performed in such a way that the first etch gas has a first electron temperature lower than a second electron temperature of the second etch gas in the second etch process.

10. The method of claim 9, wherein a xenon gas is provided during the first etch process, not during the second etch process.

11. The method of claim 9, wherein the first etch process is performed with a plasma source power, which is lower than that in the second etch process.

12. The method of claim 1, wherein the first etch process and the second etch process are performed using a first etch gas and a second etch gas, respectively, the first sidewall pattern is formed to allow for the first etch gas to be injected to the etch target layer at the first angle, and the second sidewall pattern is formed to allow for the second etch gas to be injected to the etch target layer at the second angle.

13. The method of claim 1, wherein a largest horizontal width of the first sidewall pattern is larger than that of the second sidewall pattern.

14. The method of claim 1, wherein a unit etch cycle comprises the first etch process and the second etch process, and the method further comprises repeating, at least one time, the unit etch cycle.

15. A method of fabricating a semiconductor device, the method comprising:

forming a mask structure on a substrate, the substrate provided with an etch target layer;

performing a first etch process using the mask structure as a first etch mask to etch the etch target layer and form a first trench; and performing a second etch process using the mask structure as a second etch mask to further etch the etch target layer that is exposed by the first trench and form a second trench, wherein the first etch process is performed using a first etch gas containing at least one of $C_xF_y$-based gases, where a ratio of y to x ranges from 0 to 2, and $CH_xF_y$-based gases, wherein the second etch process is performed using a second etch gas containing another at least one of $C_xF_y$-based gases, where the ratio of y to x ranges from 2 to 4, and wherein the first etch process is performed in such a way that the first etch gas has a first electron temperature lower than a second electron temperature of the second etch gas in the second etch process.

16. The method of claim 15, wherein the mask structure used as the first etch mask in the first etch process comprises a first sidewall pattern, the first sidewall pattern formed on at least a sidewall of the mask structure during the first etch process, the mask structure used as the second etch mask in the second etch process comprises a second sidewall pattern formed on at least the sidewall of the mask structure, the second sidewall pattern formed by deforming the first sidewall pattern during the second etch process, and the second sidewall pattern is formed in such a way that a second outer sidewall of the second sidewall pattern has a greater angle with respect to a top surface of the substrate than a first outer sidewall of the first sidewall pattern.

17. The method of claim 15, wherein the first etch gas is at least one of $C_4F_6$, $CHF_3$, and $CH_2F_2$, and the second etch gas is at least one of $C_4F_8$, $CF_4$, and $CF_3$.

18. A method of fabricating a semiconductor device, the method comprising:

forming a mask pattern on a substrate, the substrate provided with an etch target layer;

performing a first etch process to etch the etch target layer and form a first sub-trench, the mask pattern and a first sidewall pattern formed on a side surface of the mask pattern being used as a first etch mask in the first etch process; and performing a second etch process to further etch the etch target layer and form a second sub-trench, the mask pattern and a second sidewall pattern formed on a side surface of the mask pattern being used as a second etch mask in the second etch process, wherein a first outer sidewall of the first sidewall pattern has a first angle with respect to a top surface of the substrate, a second outer sidewall of the second sidewall pattern has a second angle with respect to the top surface of the substrate, and the first angle is greater than the second angle, wherein the first sidewall pattern is formed during the first etch process, and wherein the second sidewall pattern is formed by deforming the first sidewall pattern during the second etch process.

19. The method of claim 18, wherein the first etch process and the second etch process are performed using a first etch gas and a second etch gas, respectively, and the first etch process is performed in such a way that the first etch gas has a first electron temperature lower than a second electron temperature of the second etch gas in the second etch process.

* * * * *